(12) United States Patent
Dan et al.

(10) Patent No.: US 12,722,529 B2
(45) Date of Patent: Sep. 1, 2026

(54) BATTERY HEATING SYSTEM AND CONTROL METHOD THEREOF

(71) Applicant: CONTEMPORARY AMPEREX TECHNOLOGY (HONG KONG) LIMITED, Hong Kong (CN)

(72) Inventors: Zhimin Dan, Ningde City (CN); Xiyang Zuo, Ningde City (CN); Wei Zhang, Ningde City (CN); Yizhen Hou, Ningde City (CN); Guowei Li, Ningde City (CN); Xingyuan Wu, Ningde City (CN); Yanru Li, Ningde City (CN)

(73) Assignee: Contemporary Amperex Technology (Hong Kong) Limited, Hong Kong (CN)

( * ) Notice: Subject to any disclaimer, the term of this patent is extended or adjusted under 35 U.S.C. 154(b) by 107 days.

(21) Appl. No.: 17/078,077

(22) Filed: Oct. 22, 2020

(65) Prior Publication Data

US 2021/0043990 A1 Feb. 11, 2021

Related U.S. Application Data

(63) Continuation of application No. 16/297,233, filed on Mar. 8, 2019, now Pat. No. 10,971,771.

(30) Foreign Application Priority Data

Dec. 29, 2018 (CN) ......................... 201811641276.2

(51) Int. Cl.
*B60L 3/10* (2006.01)
*B60L 50/10* (2019.01)
(Continued)

(52) U.S. Cl.
CPC ........... *B60L 58/27* (2019.02); *H01M 10/425* (2013.01); *H01M 10/48* (2013.01);
(Continued)

(58) Field of Classification Search
CPC ............................... B60L 1/08; B60L 2200/18
See application file for complete search history.

(56) References Cited

U.S. PATENT DOCUMENTS 5,291,388 A 3/1994 Heinrich
2006/0290325 A1 12/2006 Ashtiani
(Continued)

FOREIGN PATENT DOCUMENTS

CN 103419654 A 12/2013
CN 103560304 A 2/2014
(Continued)

OTHER PUBLICATIONS

The First Office Action for India Application No. 202017047107, dated Feb. 1, 2021, 7 pages.
(Continued)

*Primary Examiner* — Kawing Chan
*Assistant Examiner* — Charles S Laughlin
(74) *Attorney, Agent, or Firm* — East IP P.C.

(57) ABSTRACT

The present disclosure provides a battery heating system and a control method thereof. The battery heating system includes a main positive switch, a main negative switch, an inverter, a motor, and a battery management unit. The inverter includes a first phase bridge arm, a second phase bridge arm and a third phase bridge arm connected in parallel. A motor controller in the inverter is configured to output a drive signal to a target upper-bridge-arm switch unit and a target lower-bridge-arm switch unit, so as to control the target upper-bridge-arm switch unit and the target lower-bridge-arm switch unit to be periodically turned on and off.
(Continued)

The battery management unit is configured to collect state parameters of the battery pack. When the state parameters of the battery pack meet preset heating conditions, a control signal is sent to the motor controller to control the motor controller to output the drive signal.

13 Claims, 4 Drawing Sheets

(51) Int. Cl.

| | |
|---|---|
| ***B60L 58/27*** | (2019.01) |
| ***H01M 10/42*** | (2006.01) |
| ***H01M 10/48*** | (2006.01) |
| ***H01M 10/615*** | (2014.01) |
| ***H01M 10/625*** | (2014.01) |
| ***H01M 10/63*** | (2014.01) |
| ***H02P 3/18*** | (2006.01) |
| ***H02P 27/06*** | (2006.01) |
| *H02J 7/00* | (2006.01) |
| *H03K 19/20* | (2006.01) |

(52) U.S. Cl.

CPC ....... *H01M 10/486* (2013.01); *H01M 10/615* (2015.04); *H01M 10/625* (2015.04); *H01M 10/63* (2015.04); *H02P 3/18* (2013.01); *H02P 27/06* (2013.01); *H01M 2010/4271* (2013.01); *H01M 2220/20* (2013.01); *H02J 7/0025* (2020.01); *H03K 19/20* (2013.01)

(56) References Cited

U.S. PATENT DOCUMENTS

| | | | | |
|---|---|---|---|---|
| 2011/0251745 | A1 | 10/2011 | Yamamoto et al. | |
| 2011/0298427 | A1 | 12/2011 | Uemura et al. | |
| 2012/0200241 | A1* | 8/2012 | Kojima | B60L 58/25 318/139 |
| 2012/0280660 | A1 | 11/2012 | Uemura et al. | |
| 2013/0134146 | A1 | 5/2013 | Han et al. | |
| 2013/0330578 | A1* | 12/2013 | Domel | B60H 1/143 429/50 |
| 2015/0185095 | A1 | 7/2015 | Wu et al. | |
| 2015/0295514 | A1* | 10/2015 | Yamagami | B60L 58/12 363/98 |
| 2017/0264108 | A1 | 9/2017 | Ito et al. | |
| 2018/0102723 | A1* | 4/2018 | Kawashima | H02P 21/22 |
| 2018/0108951 | A1 | 4/2018 | Beuning et al. | |
| 2018/0281600 | A1 | 10/2018 | Zhou et al. | |

FOREIGN PATENT DOCUMENTS

| | | | | |
|---|---|---|---|---|
| CN | 204376462 U | | 6/2015 | |
| CN | 103560304 B | | 5/2016 | |
| CN | 105762434 A | | 7/2016 | |
| CN | 104538701 B | | 8/2016 | |
| CN | 105932363 A | | 9/2016 | |
| CN | 106025443 A | | 10/2016 | |
| CN | 107666028 A | | 2/2018 | |
| CN | 108123637 A | | 6/2018 | |
| CN | 108306078 A | | 7/2018 | |
| CN | 105762434 B | | 12/2018 | |
| JP | 2012120347 A | | 6/2012 | |
| JP | 2012135085 A | | 7/2012 | |
| JP | 2014-72955 A | | 4/2014 | |
| JP | 2014-073045 A | | 4/2014 | |
| JP | 2014072955 A | | 4/2014 | |
| JP | 2015216776 A | | 12/2015 | |
| JP | 2016-165201 A | | 9/2016 | |
| KR | 20070028906 A | | 3/2007 | |
| WO | 2010/050045 A1 | | 5/2010 | |
| WO | WO-2012127665 A1 | * | 9/2012 | H02P 27/08 |

OTHER PUBLICATIONS

The First Office Action for Japanese Application No. 2021-057659, dated Feb. 14, 2022, 6 pages.

The Extended European Search Report for European Application No. 19161118.5, dated Sep. 27, 2019, 21 pages.

The International Search Report for PCT/CN2019/129258, dated Mar. 26, 2020, 11 pages.

The First Office Action for Chinese Application No. 20181164-1276.2 , dated Jul. 21, 2020, 11 pages.

The First Office Action for Japanese Application No. 2019-236180, dated Jan. 4, 2021, 10 pages.

The First Office Action for KR Application No. 10-2020-7031197 , dated Mar. 29, 2022, 25 pages.

The First Office Action for U.S. Appl. No. 16/297,233 , dated Jan. 30, 2020, 36 pages.

* cited by examiner

BATTERY HEATING SYSTEM AND CONTROL METHOD THEREOF

CROSS-REFERENCE TO RELATED APPLICATION

This application is a continuation of U.S. patent application Ser. No. 16/297,233 filed on Mar. 8, 2019, which is based upon and claims priority to Chinese Patent Application No. 201811641276.2, filed on Dec. 29, 2018. The aforementioned patent applications are incorporated herein by reference in their entireties.

FIELD

The present disclosure relates to the field of battery power, and particularly to a battery heating system and a control method thereof.

BACKGROUND

With development of new energy, new energy is used as power in more and more fields. Due to advantages of high energy density, recyclable charging, safety and environmental friendliness and so on, batteries are widely used in new energy vehicles, consumer electronics, energy storage systems and other fields.

However, use of a battery in low temperature environment is subject to certain restrictions. Specifically, discharge capacity of the battery is degraded seriously in low temperature environment, and the battery cannot be charged in low temperature environment. Therefore, in order to be able to use the battery normally, it is necessary to heat the battery in low temperature environment.

At present, the battery may be heated by providing a special thermal cycle container for the battery and indirectly heating heat-conducting material in the thermal cycle container to conduct heat to the battery. However, this heating method takes a long time and the heating efficiency is low.

SUMMARY

In a first aspect, the embodiments of the present disclosure provide a battery heating control method. The method includes: collecting, by a battery management unit, state parameters of a battery pack, wherein the state parameters of the battery pack comprises a temperature and a state of charge of the battery pack; sending, by the battery management unit, a heating instruction to a vehicle controller under a condition that the state parameters of the battery pack meet preset heating conditions, wherein the preset heating conditions comprise the temperature is lower than a desired temperature threshold and the state of charge is higher than a heating allowable state of charge threshold, wherein the heating instruction is forwarded to a motor controller by the vehicle controller under a condition that a motor is determined in a non-operating state, so that communication parameters for the motor controller and the battery management unit are set by the vehicle controller in response to a communication request sent by the motor controller based on the heating instruction; performing, by the battery management unit, handshake communication according to the communication parameters to establish a communication connection with the motor controller; calculating, by the battery management unit, a desired frequency and a desired duty cycle based on the state parameters of the battery pack; and sending, by the battery management unit, the desired frequency and the desired duty cycle to the motor controller, wherein the desired frequency and the desired duty cycle are used by the motor controller as a frequency and a duty cycle of a drive signal separately, wherein the drive signal is used for controlling an inverter so as to heat the battery pack.

In a second aspect, the embodiments of the present disclosure provide a battery heating control method. The method includes: receiving, by a vehicle controller, a heating instruction from a battery management unit; wherein the heating instruction is sent by the battery management unit under a condition that state parameters of a battery pack meet preset heating conditions, wherein the state parameters of the battery pack comprises a temperature and a state of charge of the battery pack, and the preset heating conditions comprise the temperature is lower than a desired temperature threshold and the state of charge is higher than a heating allowable state of charge threshold; forwarding, by the vehicle controller, the heating instruction to a motor controller under a condition that a motor is determined in a non-operating state; receiving, by the vehicle controller, a communication request from the motor controller; wherein the communication request is sent by the motor controller based on the heating instruction; and setting, by the vehicle controller, communication parameters for the motor controller and the battery management unit, wherein the communication parameters are used for the battery management unit to establish a communication connection with the motor controller, wherein the communication connection is used by the battery management unit to send a desired frequency and a desired duty cycle to the motor controller, wherein the desired frequency and the desired duty cycle are used by the motor controller as a frequency and a duty cycle of a drive signal separately, wherein the drive signal is used for controlling an inverter so as to heat the battery pack.

BRIEF DESCRIPTION OF THE DRAWINGS

The present disclosure may be better understood from the following description of the Detailed Description of the present disclosure with reference to the attached drawings, where the same or similar reference numbers represent the same or similar features.

DETAILED DESCRIPTION

Figure 1:
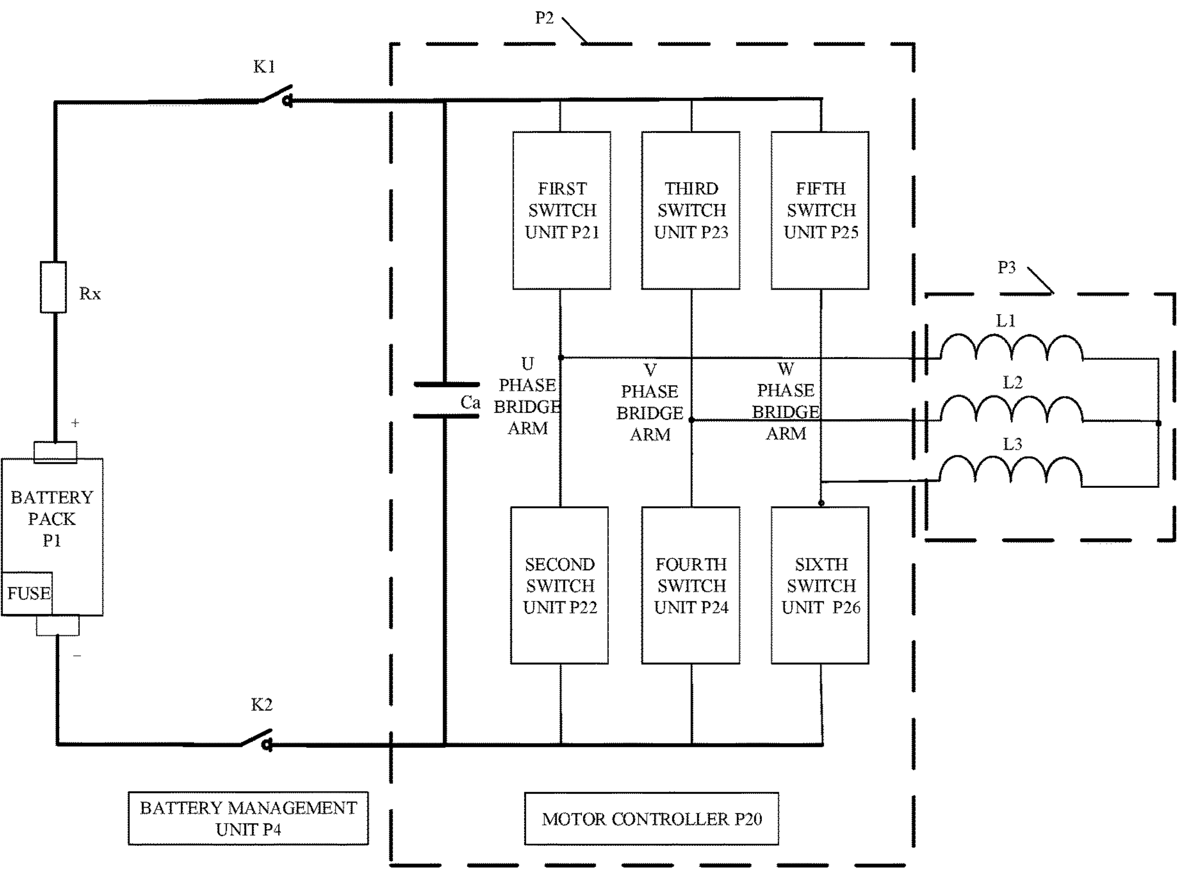
FIG. 1 is a schematic structural diagram of a battery heating system according to an embodiment of the present disclosure.

Various aspects of features and exemplary embodiments of the present disclosure will be described in detail below. A number of specific details are presented in the following detailed description to provide a comprehensive understanding of the present disclosure. However, it will be apparent to those skilled in the art that the present disclosure may be practiced without some of these specific details. The following description of the embodiments is merely to provide a better understanding of the present disclosure by illustrating examples thereof. The present disclosure is by no means limited to any specific configuration and algorithm set forth below, but covers any modification, replacement and improvement of elements, components and algorithms without departing from the spirit of the present disclosure. Well-known structures and techniques are not shown in the drawings and the following description, so as to avoid unnecessary ambiguity of the present disclosure.

The embodiments of the present disclosure provide a battery heating system and a control method thereof, which may be applied to heating a battery pack when a temperature of the battery pack is low, so that the temperature of the battery pack rises to a temperature at which the battery pack may be normally used. The battery pack may include at least one battery unit or at least one battery unit, which is not limited herein. The battery pack may be applied to an electric vehicle to supply power to a motor as a power source for the electric vehicle. The battery pack may also supply power to other power consumption devices in the electric vehicle, such as an in-car air conditioner, an on-board player, and the like. In the embodiments of the present disclosure, by controlling the battery heating system, an alternating current is generated in a circuit in which the battery pack is located. The alternating current may continuously pass through the battery pack, so that an internal resistance of the battery pack generates heat, thereby achieving uniform and high-efficiency heating of the battery pack.

FIG. 1 is a schematic structural diagram of a battery heating system according an embodiment of the present disclosure. As shown in FIG. 1, the battery heating system includes a main positive switch K1 connected to a positive electrode of the battery pack P1, a main negative switch K2 connected to a negative electrode of the battery pack P1, a inverter P2 connected to the main positive switch K1 and the main negative switch K2, a motor P3 connected to the inverter P2, and a battery management unit P4.

In some examples, the main positive switch K1 and the main negative switch K2 may be relays.

The inverter P2 includes a supporting capacitor, a first phase bridge arm, a second phase bridge arm and a third phase bridge arm that are connected in parallel. The first phase bridge arm, the second phase bridge arm and the third phase bridge arm each have an upper bridge arm and a lower bridge arm, the upper bridge arm is provided with a switch unit, and the lower bridge arm is provided with a switch unit.

For example, as shown in FIG. 1, the first phase bridge arm is a U-phase bridge arm, the second phase bridge arm is a V-phase bridge arm, and the third phase bridge arm is a W-phase bridge arm. A switch unit of an upper bridge arm of the U-phase bridge arm is a first switch unit P21, and a switch unit of a lower bridge arm of the U-phase bridge arm is a second switch unit P22. A switch unit of an upper bridge arm of the V-phase bridge arm is a third switch unit P23, and a switch unit of a lower bridge arm of the V-phase bridge arm is a fourth switch unit P24. A switch unit of an upper bridge arm of the W-phase bridge arm is a fifth switch unit P25, and a switch unit of a lower bridge arm of the W-phase bridge arm is a sixth switch unit P26.

In some examples, the switch unit may include one or more of power switching devices, such as an Insulated Gate Bipolar Transistor (IGBT) chip, an IGBT unit, and a Metal-Oxide-Semiconductor Field-Effect Transistor (MOSFET) and the like. Here, a combination manner and a connection manner of each IGBT device, each MOSFET device and the like in the switch unit are not limited. The material type of the power switching devices described above is also not limited. For example, a power switching device made of silicon carbide (SiC) or other materials may be used. It is worth mentioning that the power switching devices described above have a diode. Specifically, the diode may be a parasitic diode or a specially designed diode. The material type of the diode is also not limited, and for example a diode made of silicon (Si), silicon carbide (SiC), or other materials may be used.

One end of the supporting capacitor Ca is connected to one end of the first phase bridge arm connected to the main positive switch K1, and the other end of the supporting capacitor Ca is connected to the other end of the first phase bridge arm connected to the main negative switch K2. The supporting capacitor Ca is used to absorb a high pulsating voltage and current that may be generated when the switch unit is disconnected, so that a voltage fluctuation and a current fluctuation in the battery heating system can be kept within an allowable range, and a voltage or current overshoot can be avoided.

A first phase input terminal, a second phase input terminal and a third phase input terminal of the motor P3 are respectively connected to a connection point of the upper bridge arm and the lower bridge arm in the first phase bridge arm, a connection point of the upper bridge arm and the lower bridge arm in the second phase bridge arm and a connection point of the upper bridge arm and the lower bridge arm in the third phase bridge arm.

For example, as shown in FIG. 1, stators of the motor P3 are equivalent to a three-phase stator inductor. The stator inductor has an energy storage function. Each phase stator inductor is connected to one phase bridge arm. The three-phase stator inductor may be taken as a first stator inductor L1, a second stator inductor L2 and a third stator inductor L3, respectively. The first phase input terminal is an input terminal corresponding to the first stator inductor L1. The second phase input terminal is an input terminal corresponding to the second stator inductor L2. The third phase input terminal is an input terminal corresponding to the third stator inductor L3. It is worth mentioning that the first phase input terminal, the second phase input terminal and the third phase input terminal of the motor P3 may be used as an input terminal to input current or an output terminal to output current.

Specifically, one end of the first stator inductor L1 is the first phase input terminal, and the other end of the first stator inductor L1 is connected to the other end of the second stator inductor L2 and the other end of the third stator inductor L3. One end of the second stator inductor L2 is the second phase input terminal. One end of the third stator inductor L3 is the third phase input terminal.

The inverter P2 described above further includes a motor controller P20. The motor controller P20 is used to output a drive signal to a target upper-bridge-arm switch unit and a target lower-bridge-arm switch unit to control the target upper-bridge-arm switch unit and the target lower-bridge-arm switch unit to be periodically turned on and off. It should be noted that the motor controller P20 is connected to each of the switch units in the inverter P2, and the connection relationship is not shown in FIG. 1.

The drive signal may specifically be a pulse signal. Further, the drive signal may be a Pulse Width Modulation (PWM) signal. In some examples, a high level signal in the drive signal may drive the switch unit to be turned on, and a low level signal in the drive signal may drive the switch unit to be turned off. The drive signal may control the target upper-bridge-arm switch unit and the target lower-bridge-arm switch unit to be periodically turned on and off.

The target upper-bridge-arm switch unit is a switch unit of an upper bridge arm of any one of the first phase bridge arm, the second phase bridge arm and the third phase bridge arm. The target lower-bridge-arm switch unit is a switch unit of a lower bridge arm of at least one of the bridge arms except the bridge arm where the target upper-bridge-arm switch unit is located.

It should be noted that the switch units not driven by the drive signal (that is, the switch units other than the target upper-bridge-arm switch unit and the target lower-bridge-arm switch unit) are turned off.

For example, as shown in FIG. 1, if the target upper-bridge-arm switch unit is the first switch unit P21, the target lower-bridge-arm switch unit is the fourth switch unit P24 and/or the sixth switch unit P26. If the target upper-bridge-arm switch unit is the third switch unit P23, the target lower-bridge-arm switch unit is the second switch unit P22 and/or the sixth switch unit P26. If the target upper-bridge-arm switch unit is the fifth switch unit P25, the target lower-bridge-arm switch unit is the second switch unit P22 and/or the fourth switch unit P24.

It should be noted that in each cycle of periodical turning-on and turning-off, the drive signal may drive a same or different target upper-bridge-arm switch unit and a same or different target lower-bridge-arm switch unit to be turned on or turned off, which is not limited herein. For example, the drive signal drives the first switch unit P21 and the fourth switch unit P24 to be turned on and off in each cycle. For example, in a first cycle, the drive signal drives the first switch unit P21 and the fourth switch unit P24 to be turned on and off; in a second cycle, the drive signal drives the third switch unit P23 and the second switch unit P22 to be turned on and off; in a third cycle, the drive signal drives the first switch unit P21, the fourth switch unit P24 and the sixth switch unit P26 to be turned on and off. That is, in different cycles, the target upper-bridge-arm switch unit and the target lower-bridge-arm switch unit driven by the drive signal may be different.

The drive signal drives the target upper-bridge-arm switch unit and the target lower-bridge-arm switch unit to be periodically turned on and off, thereby generating an alternating current in a circuit formed by the battery pack P1, the main positive switch K1, the target upper-bridge-arm switch unit, the motor P3, the target lower-bridge-arm switch unit, and the main negative switch K2. Specifically, an alternating sine wave current may be generated. That is, the battery pack P1 is charged and discharged alternately. During the alternate charging and discharging of the battery pack P1, the battery pack P1 generates heat, that is, the battery pack P1 generates heat internally, thereby heating the battery pack P1.

The battery management unit P4 is used to collect state parameters of the battery pack P1. When the state parameters of the battery pack P1 meet preset heating conditions, a control signal is sent to the motor controller P20 to control the motor controller P20 to output a drive signal. A communication connection is established between the battery management unit P4 and the motor controller P20, and may be a wired connection or a wireless connection, which is not limited herein. The connection relationship is not shown in FIG. 1.

In some examples, the state parameters include a temperature and a state of charge, and the preset heating conditions include that the temperature is lower than a heating temperature threshold and the state of charge is higher than a heating allowable state of charge threshold. In other words, when the collected temperature of the battery pack is lower than the heating temperature threshold and the state of charge of the battery pack is higher than the heating allowable state of charge threshold, the battery management unit P4 sends a control signal to the motor controller P20 to control the motor controller P20 to output a drive signal.

It should be noted that the battery heating system may be installed in a power consumption device. For example, the battery heating system is installed in an electric vehicle. During the operation of the electric vehicle, both the inverter P2 and the motor P3 are in operation, and the switch units in the respective bridge arms of the inverter P2 cannot be controlled. Therefore, in the battery heating system of the embodiments of the present disclosure, when it is determined that both the inverter P2 and the motor P3 are in a non-operating state, that is, when the electric vehicle is in a static state, the battery management unit P4 performs a step of determining the state parameters of the battery pack P1 and sending a control signal to the motor controller P20. In some examples, before sending the control signal to the motor controller P20, the battery management unit P4 may first control the main negative switch K2 to be closed, and then control the main positive switch K1 to be closed. Specifically, the battery management unit P4 may report a heating instruction to the vehicle controller before sending the control signal to the motor controller P20. The vehicle controller sends a control instruction to the battery management unit P4 and the motor controller P20. The battery management unit P4 first controls the main negative switch K2 to be closed, and then controls the main positive switch K1 to be closed.

In some examples, a temperature sensor may be provided for the battery pack P1. The battery management unit P4 collects the temperature of the battery pack P1 from the temperature sensor. Here, the temperature of the battery pack P1 may specifically be a temperature of a housing of the battery pack P1, a temperature of the air in the internal space of the battery pack P1, a temperature of any one battery pack P1 or a battery unit of the battery pack P1, or an average value of temperatures of all battery packs or all battery units in the battery pack P1 and so on, which is not limited herein.

The heating temperature threshold may be a minimum required temperature at which the battery pack P1 may operate normally, that is, the temperature threshold for the battery heating system to enter a heating mode. The heating temperature threshold may be set according to a work scene and work requirements, which is not limited herein. If the temperature of the battery pack P1 is lower than the heating temperature threshold, the battery pack P1 cannot work normally and needs to be heated.

The heating allowable state of charge threshold is a minimum required state of charge for allowing the battery pack P1 to be heated, that is, the state of charge threshold for the battery heating system to enter the heating mode. The state of charge threshold may be set according to the work scene and work requirements, which is not limited herein. If the state of charge of the battery pack P1 is higher than the state of charge threshold, it means that the current power of the battery pack P1 is enough to provide the power required by the battery pack P1 to enter the heating mode.

Therefore, when the battery management unit P4 determines that the temperature of the battery pack P1 is lower than the heating temperature threshold and the state of charge of the battery pack P1 is higher than the heating allowable state of charge threshold, the battery management unit P4 sends a control signal to the motor controller P20. The control signal may trigger the motor controller P20 to output a drive signal, so that an alternating current is generated in the battery heating system, and heat is generated inside the battery pack P1, thereby heating the battery pack P1.

In FIG. 1, a resistance between the battery pack P1 and the main positive switch K1 is an equivalent internal resistance Rx of the battery pack P1. The internal resistance of the battery pack P1 increases as the temperature becomes lower. For example, the internal resistance of a power lithium battery at −25° C. is 5 to 15 times the internal resistance of the power lithium battery at 25° C. During the alternate charging and discharging of the battery pack P1, more heat is generated and the heating speed is faster. A fuse may be provided inside the battery pack P1 to ensure the safe use of the battery pack P1.

In some examples, the battery management unit P4, the main positive switch K1 and the main negative switch K2 may be packaged in a high voltage box.

In embodiments of the present disclosure, if the battery management unit P4 in the battery heating system determines the state parameters of the battery pack P1 meet the preset heating conditions, the battery management unit P4 sends a control signal to the motor controller P20, and controls the motor controller P20 to output a drive signal to the target upper-bridge-arm switch unit and the target lower-bridge-arm switch unit to control the target upper-bridge-arm switch unit and the target lower-bridge-arm switch unit to be periodically turned on and off. Thus, an alternating current is generated in a circuit formed by the battery pack P1, the main positive switch K1, the target upper-bridge-arm switch unit, the motor P3, the target lower-bridge-arm switch unit and the main negative switch K2, that is, the battery pack P1 is charged and discharged alternately. The battery pack has an internal resistance. During the alternate charging and discharging of the battery pack P1, the alternating current flows through the internal resistance of the battery pack P1 to generate heat, that is, the battery pack P1 generates heat internally, thereby improving heating efficiency of the battery pack P1. In embodiments of the present disclosure, since heat is generated by the alternating current passing through the battery pack P1, heat generation inside the battery pack P1 is uniform. Moreover, since the structures of the inverter P2 and the motor P3 are not changed, there will be no additional structural modification costs.

Figure 2:
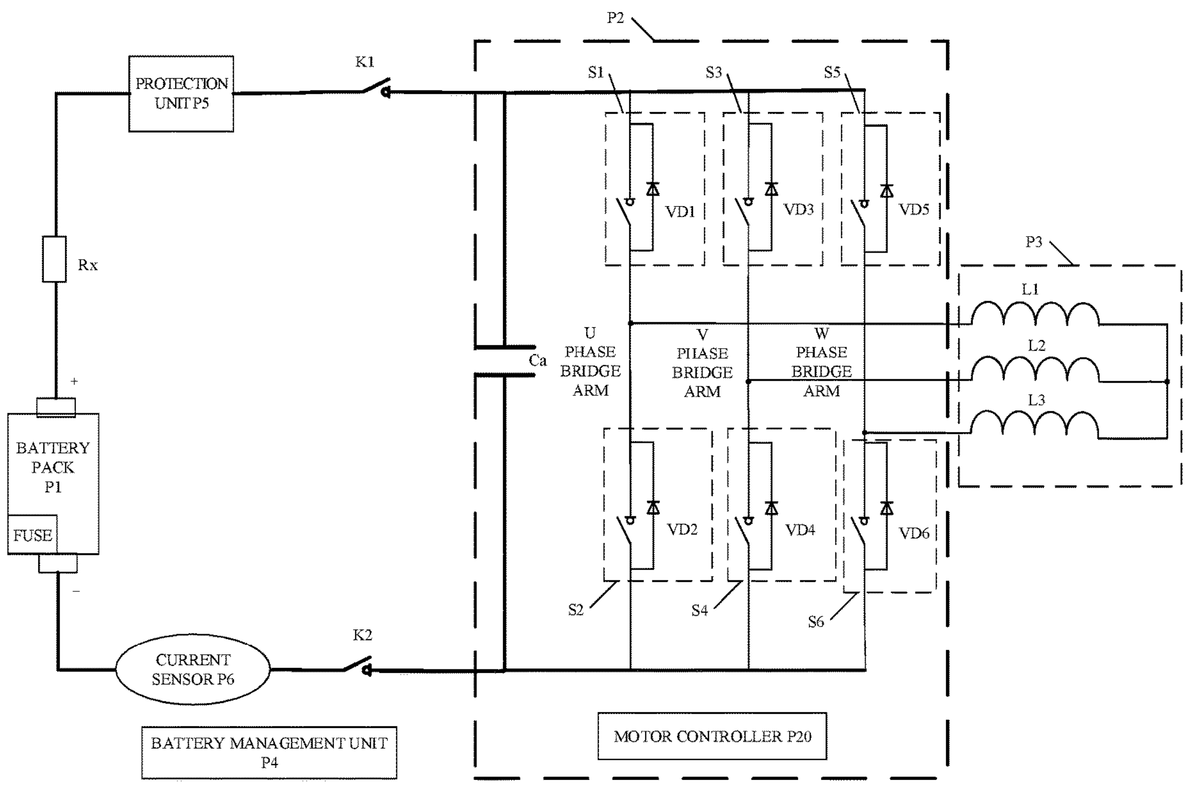
FIG. 2 is a schematic structural diagram of a battery heating system according to another embodiment of the present disclosure.

An example in which each of the switch units includes a power switching device will be described below. FIG. 2 is a schematic structural diagram of a battery heating system according to another embodiment of the disclosure. The difference between FIG. 2 and FIG. 1 is in that the switch unit includes a power switching device. The battery heating system further includes a protection unit P5 disposed between the positive electrode of the battery pack P1 and the main positive switch K1, and a current sensor P6 disposed between the negative electrode of the battery pack P1 and the main negative switch K2.

The protection unit P5 is used to disconnect the battery pack P1 from the battery heating system. In some examples, the protection unit P5 may be a Manual Service Disconnect (MSD).

The current sensor P6 may collect current parameters in the battery heating system and upload them to the battery management unit P4 for analysis and calculation. The battery management unit P4 may also wake up the current sensor P6 before sending a control signal to the motor controller P20.

As shown in FIG. 2, the first switch unit P21 includes a first power switching device S1, the second switch unit P22 includes a second power switching device S2, the third switch unit P23 includes a third power switching devices S3, the fourth switch unit P24 includes a fourth power switching device S4, the fifth switch unit P25 includes a fifth power switching device S4, and the sixth switch unit P26 includes a sixth power switching device S6. A diode of the first power switching device S1 is VD1, a diode of the second power switching device S2 is VD2, a diode of the third power switching device S3 is VD3, a diode of the fourth power switching device S4 is VD4, a diode of the fifth power switching device S5 is VD5, and a diode of the sixth power switching device S6 is VD6.

An anode of a diode of the switch unit of the upper bridge arm is connected to the connection point of the upper bridge arm and the lower bridge arm; a cathode of the diode is located between the upper bridge arm and the main positive switch K1. For example, the cathode of the diode of the switch unit of the upper bridge arm is connected to one end of the upper bridge arm connected to the main positive switch K1. The anode of the diode is located between the lower bridge arm and the main negative switch K2. For example, the anode of the diode of the switch unit of the lower bridge arm is connected to one end of the lower bridge arm connected to the main negative switch K2; the cathode of the diode of the switch unit of the lower bridge arm is connected to the connection point of the upper bridge arm and the lower bridge arm.

The drive signal drives the target upper-bridge-arm switch unit and the target lower-bridge-arm switch unit to be turned on, thereby forming a discharge circuit of the battery pack P1. The current direction is the battery pack P1→the protection unit P5→the main positive switch K1→the target upper-bridge-arm switch unit→the stator inductor corresponding to the target upper-bridge-arm switch unit→the stator inductor corresponding to the target lower-bridge-arm switch unit→the target lower-bridge-arm switch unit→the main negative switch K2→the current sensor P6→the battery pack P1.

The drive signal drives the target upper-bridge-arm switch unit and the target lower-bridge-arm switch unit to be turned off. Since the stator inductor has an energy storage function, the stator inductor discharges, thereby forming a charge circuit of the battery pack P1. The current direction is the stator inductor corresponding to the target upper-bridge-arm switch unit→the diode of the target upper-bridge-arm switch unit→the main positive switch K1→the protection unit P5→the battery pack P1→the current sensor P6→the main negative switch K2→the diode of the target lower-bridge-arm switch unit→the stator inductor corresponding to the target lower-bridge-arm switch unit.

In some examples, the frequency of the drive signal ranges from 100 Hz to 100,000 Hz. The frequency of the drive signal is the switching frequency of the switch unit. The duty cycle of the drive signal ranges from 5% to 50%. The duty cycle of the drive signal is a ratio of the turned-on time of the switch unit to the sum of the turned-on time and the turned-off time of the switch unit.

In the battery heating system, the drive signal frequently switches the control of the switch units in the respective bridge arms. If a switch unit of an upper bridge arm and a switch unit of a lower bridge arm in a same bridge arm are both turned on, for example, the switch unit of the upper bridge arm and the switch unit of the lower bridge arm in the same bridge arm are both turned on for more than 10 milliseconds, it may cause the device or the battery pack P1 in the battery heating system to be burned. In order to prevent the switch unit of the upper bridge arm and the switch unit of the lower bridge arm in the same bridge arm from being turned on simultaneously, mutual exclusion of conduction states of the switch unit of the upper bridge arm and the switch unit of the lower bridge arm in the same bridge arm may be realized by using a logic circuit in the motor controller P20.

The motor controller P20 in the embodiments of the present disclosure may include three drive signal generation units corresponding to the first phase bridge arm, the second phase bridge arm and the third phase bridge arm respectively. Each drive signal generation unit corresponds to one bridge arm.

For example, the three drive signal generation units are A1, A2 and A3 respectively. The drive signal generation unit A1 corresponds to a U-phase bridge arm in FIG. 2. The drive signal generation unit A1 has two output terminals A11 and A12. The output terminal A11 of the drive signal generation unit A1 is connected to a control terminal of the first power switching device S1 in the first switch unit P21, and outputs a drive signal to the first power switching device S1 in the first switch unit P21. The output terminal A12 of the drive signal generation unit A1 is connected to a control terminal of the second power switching device S2 in the second switch unit P22, and outputs a drive signal to the second power switching device S2 in the second switch unit P22.

The drive signal generation unit A2 corresponds to a V-phase bridge arm in FIG. 2, and the drive signal generation unit A2 has two output terminals A21 and A22. The output terminal A21 of the drive signal generation unit A2 is connected to a control terminal of the third power switching device S3 in the third switch unit P23, and outputs a drive signal to the third power switching device S3 in the third switch unit P23. The output terminal A22 of the drive signal generation unit A2 is connected to a control terminal of the fourth power switching device S4 in the fourth switch unit P24, and outputs a drive signal to the fourth power switching device S4 in the fourth switch unit P24.

The drive signal generation unit A3 corresponds to a W-phase bridge arm in FIG. 2. The drive signal generation unit A3 has two output terminals A31 and A32. The output terminal A31 of the drive signal generation unit A3 is connected to a control terminal of the fifth power switching device S5 in the fifth switch unit P25, and outputs a drive signal to the fifth power switching device S5 in the fifth switch unit P25. The output terminal A32 of the drive signal generation unit A3 is connected to a control terminal of the sixth power switching device S6 in the sixth switch unit P26, and outputs a drive signal to the sixth power switching device S6 in the sixth switch unit P26.

Figure 3:
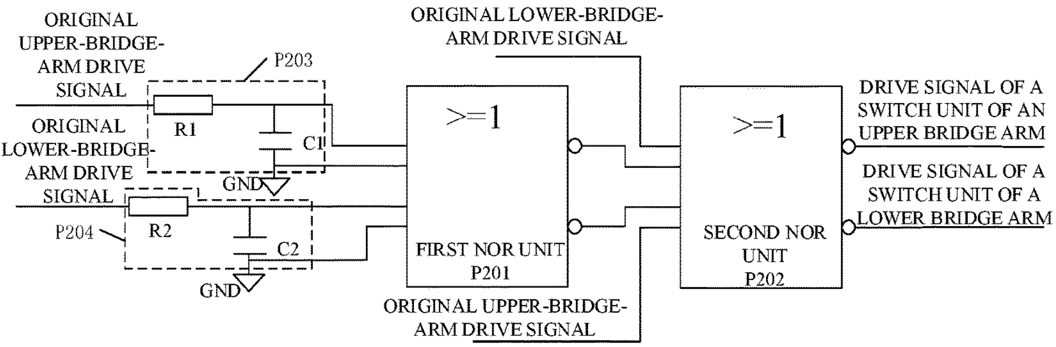
FIG. 3 is a schematic structural diagram of a drive signal generation unit according to an embodiment of the present disclosure.

One of the drive signal generation units is described below. FIG. 3 is a schematic structural diagram of a drive signal generation unit according to an embodiment of the present disclosure. As shown in FIG. 3, the drive signal generation unit includes a first filter subunit P203, a second filter subunit P204, a first NOR unit P201 and a second NOR unit P202.

A first terminal of the first filter subunit P203 is connected to an original upper-bridge-arm drive signal terminal, a second terminal of the first filter subunit P203 is connected to a first input terminal of the first NOR unit P201, and a third terminal of the first filter subunit P203 is connected to a second input terminal of the first NOR unit P201 and the ground.

Specifically, the first filter subunit may include a set of first voltage dividing resistors and a first capacitor C1. One end of the set of first voltage dividing resistors is connected to the original upper-bridge-arm drive signal terminal, and the other end of the set of first voltage dividing resistors is connected to the first input terminal of the first NOR unit P201. The set of first voltage dividing resistors may include at least one resistor. If the set of voltage dividing resistors include a plurality of resistors, the connection relationship among the plurality of resistors is not limited herein. The drive signal generation unit shown in FIG. 3 is an example in which the set of first voltage dividing resistors including one resistor R1. One end of the first capacitor C1 is connected to the other end of the set of first voltage dividing resistors, and the other end of the first capacitor C1 is connected to the second input terminal of the first NOR unit P201 and the ground.

The original upper-bridge-arm drive signal terminal provides an original upper-bridge-arm drive signal to drive the switch unit of the upper bridge arm to be turned on and off.

A first terminal of the second filter subunit P204 is connected to an original lower-bridge-arm drive signal terminal, a second terminal of the second filter subunit P204 is connected to a third input terminal of the first NOR unit P201, and a third terminal of the second filter subunit P204 is connected to a fourth input terminal of the first NOR unit P201 and the ground.

Specifically, the second filter subunit P204 may include a set of second voltage dividing resistors and a second capacitor C2. One end of the set of the second voltage dividing resistors is connected to the original lower-bridge-arm drive signal terminal, and the other end of the set of second voltage dividing resistors is connected to the third input terminal of the first NOR unit P201. If the set of second voltage dividing resistors includes a plurality of resistors, the connection relationship among the plurality of resistors is not limited herein. The drive signal generation unit shown in FIG. 3 is an example in which the set of second voltage dividing resistors includes one resistor R2. One end of the second capacitor C2 is connected to the other end of the set of second voltage dividing resistors, and the other end of the second capacitor C2 is connected to the fourth input terminal of the first NOR unit P201 and the ground.

The original lower-bridge-arm drive signal terminal provides an original lower-bridge-arm drive signal to drive the switch unit of the lower bridge arm to be turned on and off.

A first output terminal of the first NOR unit P201 is connected to a second input terminal of the second NOR unit P202, and a second output terminal of the first NOR unit P201 is connected to a third input terminal of the second NOR unit P202.

The first NOR unit P201 is used to perform a NOR operation on a signal at the first input terminal of the first NOR unit P201 and a signal at the second input terminal of the first NOR unit P201, and output an input signal to the second input terminal of the second NOR unit P202 from the first output terminal of the first NOR unit P201; and perform a NOR operation on a signal at the third input terminal of the first NOR unit P201 and a signal at the fourth input terminal of the first NOR unit P201, and output an input signal to the third input terminal of the second NOR unit P202 from the second output terminal of the first NOR unit P201.

In some examples, as shown in FIG. 3, the first NOR unit P201 may be a NOR gate device with four inputs and two outputs, and two inputs control one output.

In other examples, the first NOR unit P201 may include two NOR gate devices with two inputs and one output.

A first input terminal of the second NOR unit P202 is connected to the original lower-bridge-arm drive signal terminal, and a fourth input terminal of the second NOR unit P202 is connected to the original drive signal end of the upper bridge arm. A first output terminal of the second NOR unit P202 is connected to the control terminal of the switch unit of the upper bridge arm in the bridge arm, and a second output terminal of the second NOR unit P202 is connected to the control terminal of the switch unit of the lower bridge arm in the bridge arm.

The second NOR unit P202 is used to perform a NOR operation on a signal at the first input terminal of the second NOR unit P202 and a signal at the second input terminal of the second NOR unit P202, and output a drive signal of the switch unit of the upper bridge arm in the bridge arm from the first output terminal of the second NOR unit P202; and perform a NOR operation on a signal at the third input terminal of the second NOR unit P202 and a signal at the fourth input terminal of the second NOR unit P202, and outputs a drive signal of the switch unit of the lower bridge arm in the bridge arm from the second output terminal of the second NOR unit P202.

In some examples, as shown in FIG. 3, the second NOR unit P202 may be a NOR gate device with four inputs and two outputs, and the two inputs control one output.

In other examples, the second NOR unit P202 may include two NOR gate devices with two inputs and one output.

Signal inputs and outputs in the drive signal generation unit corresponding to the U-phase bridge arm at which the first power switching device S1 and the second power switching device S2 are located will be exemplified below with reference to FIGS. 2 and 3. Table 1 shows the signal inputs and outputs in the drive signal generation unit.

TABLE 1

| Original Drive Signal | | Drive Signal | |
|---|---|---|---|
| S1 original drive signal | S2 original drive signal | S1 drive signal | S2 drive signal |
| 1 | 1 | 0 | 0 |
| 1 | 0 | 1 | 0 |
| 0 | 1 | 0 | 1 |
| 0 | 0 | 0 | 0 |

The S1 original drive signal is the original upper-bridge-arm drive signal provided by the original upper-bridge-arm drive signal terminal of the first power switching device S1. The S2 original drive signal is the original upper-bridge-arm drive signal provided by the original upper-bridge-arm drive signal terminal of the second power switching device S2. The S1 drive signal is the drive signal of the first power switching device S1 output by the drive signal generation unit. The S2 drive signal is the drive signal of the second power switching device S2 output by the drive signal generation unit.

The "1" in Table 1 represents a high level and the "0" in Table 1 represents a low level. The high level drives a power switching device to be turned on, and the low level drives a power switching device to be turned off. As can be seen from Table 1, when the original upper-bridge-arm drive signal provided by the original upper-bridge-arm drive signal terminal and the original lower-bridge-arm drive signal provided by the original lower-bridge-arm drive signal terminal both indicate that the first power switching device S1 and the second power switching device S2 are turned on, the drive signals which are output from the drive signal generation unit and supplied to the first power switching device S1 and the second power switching device S2 are mutually exclusive. There will not be the case that the first power switching device S1 and the second power switching device S2 are simultaneously turned on. Thus, the mutual exclusion of conduction states of the switch unit of the upper bridge arm and the switch unit of the lower bridge arm in the same bridge arm is achieved.

In another embodiment, the drive signal of the switch unit of the upper bridge arm and the drive signal of the switch unit of the lower bridge arm in the same bridge arm may also be adjusted. For the drive signal of the switch unit of the upper bridge arm and the drive signal of the switch unit of the lower bridge arm in the same bridge arm, dead-time is set to avoid the simultaneous turning on of the switch unit of the upper bridge arm and the switch unit of the lower bridge arm in the same bridge arm. Specifically, the dead-time is set between the time when the level of the drive signal of the switch unit of the upper bridge arm in the same bridge arm changes and the time when the level of the drive signal of the switch unit of the lower bridge arm in the same bridge arm changes.

In some examples, the dead-time is related to a turn-on delay, a turn-on duration, a turn-off delay, and a turn-off duration of the switch unit. For example, the dead-time may be set according to equation (1):

$$\text{dead-time}=[(\text{turn-off delay}-\text{turn-on delay})+(\text{turn-off duration}-\text{turn-on duration})]\times D \quad (1),$$

where D is a calculation parameter, and D ranges from 1.1 to 2.

Figure 4:
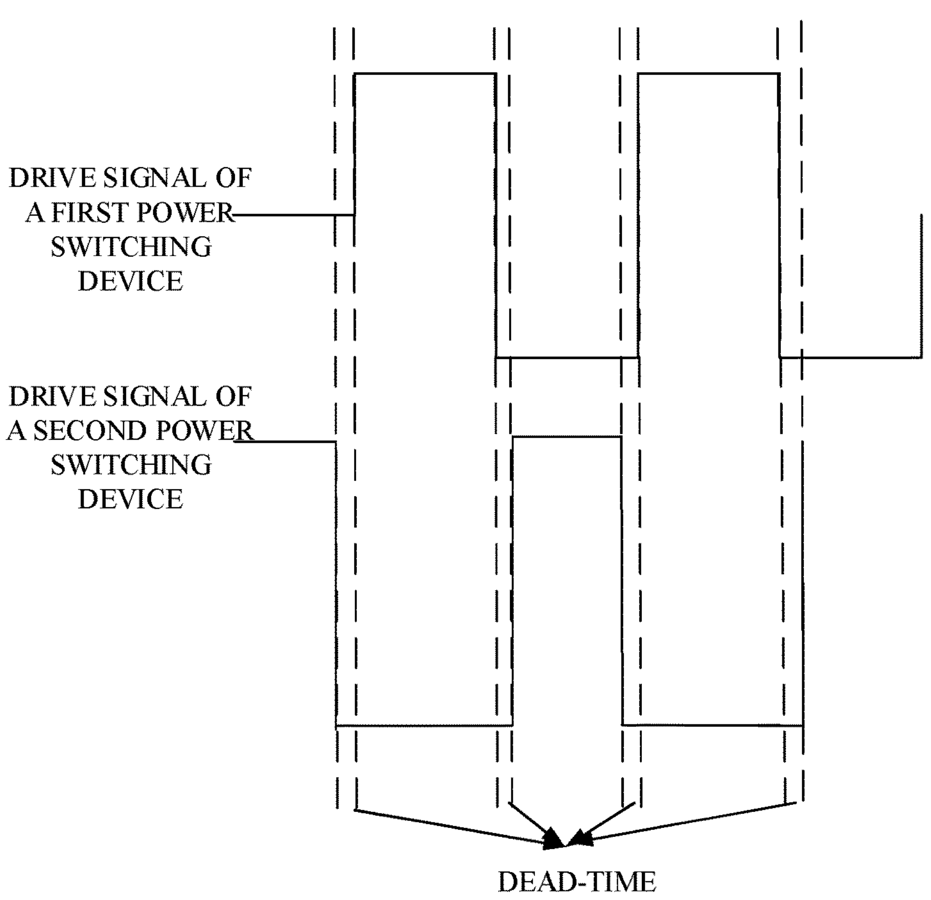
FIG. 4 is a schematic diagram of dead-time in a drive signal according to an embodiment of the present disclosure.

For example, FIG. 4 is a schematic diagram of dead-time in a drive signal according to an embodiment of the present disclosure. FIG. 4 shows the drive signal of the first power switching device and the drive signal of the second power switching device in the battery heating system in FIG. 2.

As shown in FIG. 4, a horizontal axis represents time. The time difference between the time when the drive signal of the first power switching device changes from the low level to the high level and the time when the drive signal of the second power switching device changes from the high level to the low level is the dead-time. The time difference between the time when the drive signal of the first power switching device changes from the high level to the low level and the time when the drive signal of the second power switching device changes from the low level to the high level is the dead-time. By setting the dead-time, it is possible to avoid the case that the first power switching device S1 and the second power switching device S2 are simultaneously turned on, so that the mutual exclusion of conduction states of the switch unit of the upper bridge arm and turning on of the switch unit of the lower bridge arm in the same bridge arm is achieved.

It should be noted that the drive signal generation unit and the dead-time described above may be simultaneously provided in the battery heating system to improve the safety of the battery heating system.

In some examples, the battery heating system may also include a vehicle controller (not shown in FIG. 1 and FIG. 2). If the battery heating system is installed in an electric vehicle, communication between the battery management unit and the motor controller needs to be established in advance. The vehicle controller is used to detect a state of the vehicle. If the vehicle controller determines that the motor is in a non-operating state, a heating instruction is sent to the motor controller P20. The heating instruction is used to indicate that the battery heating system needs to enter the heating mode. The motor controller P20 receives the heating instruction sent by the vehicle controller and sends a communication request to the vehicle controller. The vehicle controller receives the communication request sent by the motor controller P20, and opens the authority of communication between the motor controller P20 and the battery management unit P4. Thus, a communication connection may be established between the motor controller P20 and the battery management unit P4.

Figure 5:
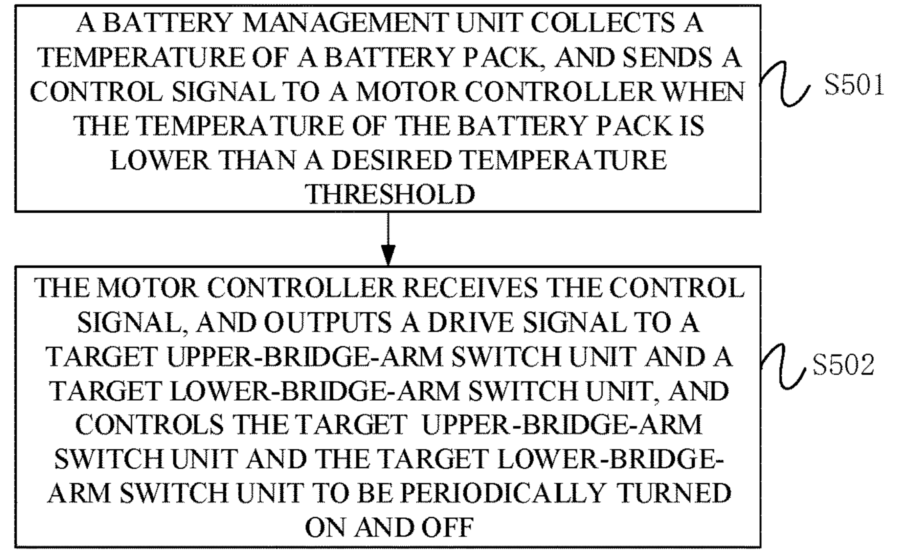
FIG. 5 is a flowchart of a control method of a battery heating system according to an embodiment of the present disclosure.

FIG. 5 is a flowchart of a control method of a battery heating system according to an embodiment of the present disclosure. The control method may be applied to the battery heating system shown in FIGS. 1 and 2 described above. As shown in FIG. 5, the control method of the battery heating system may include step S501 and step S502.

In step S501, the battery management unit collects state parameters of the battery pack, and sends a control signal to the motor controller when the state parameters of the battery pack meet the preset heating conditions.

In some examples, the state parameters include a temperature and a state of charge. The preset heating conditions include that the temperature is lower than a desired temperature threshold and that the state of charge is higher than a heating allowable state of charge threshold.

In step S502, the motor controller receives the control signal, and outputs a drive signal to the target upper-bridge-arm switch unit and the target lower-bridge-arm switch unit, and controls the target upper-bridge-arm switch unit and the target lower-bridge-arm switch unit to be periodically turned on and off.

There are several manners to select the target upper-bridge-arm switch unit and the target lower-bridge-arm switch unit. For example, there are nine manners to select the target upper-bridge-arm switch unit and the target lower-bridge-arm switch unit:

A first manner: the target upper-bridge-arm switch unit includes the switch unit of the upper bridge arm of the first phase bridge arm, and the target lower-bridge-arm switch unit includes the switch unit of the lower bridge arm of the second phase bridge arm.

A second manner: the target upper-bridge-arm switch unit includes the switch unit of the upper bridge arm of the first phase bridge arm, and the target lower-bridge-arm switch unit includes the switch unit of the lower bridge arm of the third phase bridge arm.

A third manner: the target upper-bridge-arm switch unit includes the switch unit of the upper bridge arm of the first phase bridge arm, and the target lower-bridge-arm switch unit includes the switch unit of the lower bridge arm of the second phase bridge arm and the switch unit of the lower bridge arm of the third phase bridge arm.

A fourth manner: the target upper-bridge-arm switch unit includes the switch unit of the upper bridge arm of the second phase bridge arm, and the target lower-bridge-arm switch unit includes the switch unit of the lower bridge arm of the first phase bridge arm.

A fifth manner: the target upper-bridge-arm switch unit includes the switch unit of the upper bridge arm of the second phase bridge arm, and the target lower-bridge-arm switch unit includes the switch unit of the lower bridge arm of the third phase bridge arm.

A sixth manner: the target upper-bridge-arm switch unit includes the switch unit of the upper bridge arm of the second phase bridge arm, and the target lower-bridge-arm switch unit includes the switch unit of the lower bridge arm of the first phase bridge arm and the switch unit of the lower bridge arm of the third phase bridge arm.

A seventh manner: the target upper-bridge-arm switch unit includes the switch unit of the upper bridge arm of the third phase bridge arm, and the target lower-bridge-arm switch unit includes the switch unit of the lower bridge arm of the first phase bridge arm.

A eighth manner: the target upper-bridge-arm switch unit includes the switch unit of the upper bridge arm of the third phase bridge arm, and the target lower-bridge-arm switch unit includes the switch unit of the lower bridge arm of the second phase bridge arm.

A ninth manner: the target upper-bridge-arm switch unit includes a switch unit of the upper bridge arm of the third phase bridge arm, and the target lower-bridge-arm switch unit includes the switch unit of the lower bridge arm of the first phase bridge arm and the switch unit of the lower bridge arm of the second phase bridge arm.

If the target upper-bridge-arm switch unit and the target lower-bridge-arm switch unit are selected differently, a transmission circuit of the alternating current is also different. The battery heating system shown in FIG. 2 will be taken as an example to illustrate the transmission circuit and current direction of the alternating current generated in the battery heating system.

In the first manner, the drive signal sent by the motor controller P20 to the first power switching device S1 and the fourth power switching device S4 drives the first power switching device S1 and the fourth power switching device S4 to be turned on. The battery pack P1 is discharged to form a discharge circuit of the battery pack P1. The current direction is the battery pack P1→the protection unit P5→the main positive switch K1→the first power switching device S1→the first stator inductor L1→the second stator inductor L2→the fourth power switching device S4→the main negative switch K2→the current sensor P6→the battery pack P1.

The drive signal sent by the motor controller P20 to the first power switching device S1 and the fourth power switching device S4 drives the first power switching device S1 and the fourth power switching device S4 to be turned off. The first stator inductor L1 and the second stator inductor L2 are discharged, and the battery pack P1 is charged to form a charge circuit of the battery pack P1. The current direction is the first stator inductor L1→the diode VD1 of the first power switching device S1→the main positive switch K1→the protection unit P5→the battery pack P1→the current sensor P6→the main negative switch K2→the diode VD4 of the fourth power switching device S4→the second stator inductor L2.

In the second manner, the drive signal sent by the motor controller P20 to the first power switching device S1 and the sixth power switching device S6 drives the first power switching device S1 and the sixth power switching device S6 to be turned on. The battery pack P1 is discharged to form a discharge circuit of the battery pack P1. The current direction is the battery pack P1→the protection unit P5→the main positive switch K1→the first power switching device S1→the first stator inductor L1→the third stator inductor L3→the sixth power switching device S6→the main negative switch K2→the current sensor P6→the battery pack P1.

The drive signal sent by the motor controller P20 to the first power switching device S1 and the sixth power switching device S6 drives the first power switching device S1 and the sixth power switching device S6 to be turned off. The first stator inductor L1 and the third stator inductor L3 are discharged, and the battery pack P1 is charged to form a charge circuit of the battery pack P1. The current direction is the first stator inductor L1→the diode VD1 of the first power switching device S1→the main positive switch K1→the protection unit P5→the battery pack P1→the current sensor P6→the main negative switch K2→the diode VD6 of the sixth power switching device S6→the third stator inductor L3.

In the third manner, the drive signal sent by the motor controller P20 to the first power switching device S1, the fourth power switching device S4, and the sixth power switching device S6 drives the first power switching device S1 and the fourth power switching device S4 and the sixth power switching device S6 to be turned on. The battery pack P1 is discharged to form a discharge circuit of the battery pack P1. The current direction is the battery pack P1→the protection unit P5→the main positive switch K1→the first power switching device S1→the first stator inductor L1→the second stator inductor L2 and the third stator inductor L3→the fourth power switching device S4 and the sixth power switching devices S6→the main negative switch K2→the current sensor P6→the battery pack P1. That is, the second stator inductor L2 and the third stator inductor L3 are connected in parallel, and then connected in series with the first stator inductor L1.

The drive signal sent by the motor controller P20 to the first power switching device S1, the fourth power switching device S4, and the sixth power switching device S6 drives the first power switching device S1, the fourth power switching device S4, and the sixth power switching device S6 to be turned off. The first stator inductor L1, the second stator inductor L2, and the third stator inductor L3 are discharged, and the battery pack P1 is charged to form a charge circuit of the battery pack P1. The current direction is the first stator inductor L1→the diode VD1 of the first power switching device S1→the main positive switch K1→the protection unit P5→the battery pack P1→the current sensor P6→the main negative switch K2→the diode VD4 of the fourth power switching device S4 and the diode VD6 of the sixth power switching device S6→the second stator inductor L2 and the third stator inductor L3.

In the fourth manner, the drive signal sent by the motor controller P20 to the third power switching device S3 and the second power switching device S2 drives the third power switching device S3 and the second power switching device S2 to be turned on. The battery pack P1 is discharged to form a discharge circuit of the battery pack P1. The current direction is the battery pack P1→the protection unit P5→the main positive switch K1→the third power switching device S3→the second stator inductor L2→the first stator inductor L1→the second power switching device S2→the main negative switch K2→the current sensor P6→the battery pack P1.

The drive signal sent by the motor controller P20 to the third power switching device S3 and the second power switching device S2 drives the third power switching device S3 and the second power switching device S2 to be turned off. The second stator inductor L2 and the first stator inductor L1 are discharged, and the battery pack P1 is charged to form a charge circuit of the battery pack P1. The current direction is the second stator inductor L2→the diode VD3 of the third power switching device S3→the main positive switch K1→the protection unit P5→the battery pack P1→the current sensor P6→the main negative switch K2→the diode VD2 of the second power switching device S2→the first stator inductor L1.

In the fifth manner, the drive signal sent by the motor controller P20 to the third power switching device S3 and the sixth power switching device S6 drives the third power switching device S3 and the sixth power switching device S6 to be turned on. The battery pack P1 is discharged to form a discharge circuit of the battery pack P1. The current direction is the battery pack P1→the protection unit P5→the main positive switch K1→the third power switching device S3→the second stator inductor L2→the third stator inductor L3→the sixth power switching device S6→the main negative switch K2→the current sensor P6→the battery pack P1.

The drive signal sent by the motor controller P20 to the third power switching device S3 and the sixth power switching device S6 drives the third power switching device S3 and the sixth power switching device S6 to be turned off. The second stator inductor L2 and the third stator inductor L3 are discharged, and the battery pack P1 is charged to form a charge circuit of the battery pack P1. The current direction is the second stator inductor L2→the diode VD3 of the third power switching device S3→the main positive switch K1→the protection unit P5→the battery pack P1→the current sensor P6→the main negative switch K2→the diode VD6 of the sixth power switching device S6→the third stator inductor L3.

In the sixth manner, the drive signal sent by the motor controller P20 to the third power switching device S3, the second power switching device S2, and the sixth power switching device S6 drives the third power switching device S3, the second power switching device S2 and the sixth power switching device S6 to be turned on. The battery pack P1 is discharged to form a discharge circuit of the battery pack P1. The current direction is the battery pack P1→the protection unit P5→the main positive switch K1→the third power switching device S3→the second stator inductor L2→the first stator inductor L1 and the third stator inductor L3→the second power switching device S2 and the sixth power switching devices S6→the main negative switch K2→the current sensor P6→the battery pack P1. That is, the first stator inductor L1 and the third stator inductor L3 are connected in parallel, and then connected in series with the second stator inductor L2.

The drive signal sent by the motor controller P20 to the third power switching device S3, the second power switching device S2, and the sixth power switching device S6 drives the third power switching device S3, the second power switching device S2, and the sixth power switching device S6 to be turned off. The second stator inductor L2, the first stator inductor L1, and the third stator inductor L3 are discharged, and the battery pack P1 is charged to form a charge circuit of the battery pack P1. The current direction is the second stator inductor L2→the diode VD3 of the third power switching device S3→the main positive switch K1→the protection unit P5→the battery pack P1→the current sensor P6→the main negative switch K2→the diode VD2 of the second power switching device S2 and the diode VD6 of the sixth power switching device S6→the first stator inductor L1 and the third stator inductor L3.

In the seventh manner, the drive signal sent by the motor controller P20 to the fifth power switching device S5 and the second power switching device S2 drives the fifth power switching device S5 and the second power switching device S2 to be turned on. The battery pack P1 is discharged to form a discharge circuit of the battery pack P1. The current direction is the battery pack P1→the protection unit P5 the main positive switch K1→the fifth power switching device S5→the third stator inductor L3→the first stator inductor L1→the second power switching device S2→the main negative switch K2→the current sensor P6→the battery pack P1.

The drive signal sent by the motor controller P20 to the fifth power switching device S5 and the second power switching device S2 drives the fifth power switching device S5 and the second power switching device S2 to be turned off. The third stator inductor L3 and the first stator inductor L1 are discharged, and the battery pack P1 is charged to form a charge circuit of the battery pack P1. The current direction is the third stator inductor L3→the diode VD5 of the fifth power switching device S5→the main positive switch K1→the protection unit P5→the battery pack P1→the current sensor P6→the main negative switch K2→the diode VD2 of the second power switching device S2→the first stator inductor L1.

In the eighth manner, the drive signal sent by the motor controller P20 to the fifth power switching device S5 and the fourth power switching device S4 drives the fifth power switching device S5 and the fourth power switching device S4 to be turned on. The battery pack P1 is discharged to form a discharge circuit of the battery pack P1. The current direction is the battery pack P1→the protection unit P5→the main positive switch K1→the fifth power switching device S5→the third stator inductor L3→the second stator inductor L2→the fourth power switching device S4→the main negative switch K2→the current sensor P6→the battery pack P1.

The drive signal sent by the motor controller P20 to the fifth power switching device S5 and the fourth power switching device S4 drives the fifth power switching device S5 and the fourth power switching device S4 to be turned off. The third stator inductor L3 and the second stator inductor L2 are discharged, and the battery pack P1 is charged to form a charge circuit of the battery pack P1. The current direction is the third stator inductor L3→the diode VD5 of the fifth power switching device S5→the main positive switch K1→the protection unit P5→the battery pack P1→the current sensor P6→the main negative switch K2→the diode VD4 of the fourth power switching device S4→the second stator inductor L2.

In the ninth manner, the drive signal sent by the motor controller P20 to the fifth power switching device S5, the second power switching device S2, and the fourth power switching device S4 drives the fifth power switching device S5, the second power switching device S2 and the fourth power switching device S4 to be turned on. The battery pack P1 is discharged to form a discharge circuit of the battery pack P1. The current direction is the battery pack P1→the protection unit P5→the main positive switch K1→the fifth power switching device S5→the third stator inductor L3→the first stator inductor L1 and the second stator inductor L2→the second power switching device S2 and the fourth power switching devices S4→the main negative switch K2→the current sensor P6→the battery pack P1. That is, the first stator inductor L1 and the second stator inductor L2 are connected in parallel, and then connected in series with the third stator inductor L3.

The drive signal sent by the motor controller P20 to the fifth power switching device S5, the second power switching device S2, and the fourth power switching device S4 drives the fifth power switching device S5, the second power switching device S2, and the fourth power switching device S4 to be turned off. The third stator inductor L3, the first stator inductor L1, and the second stator inductor L2 are discharged, and the battery pack P1 is charged to form a charge circuit of the battery pack P1. The current direction is the third stator inductor L3→the diode VD5 of the fifth power switching device S5→the main positive switch K1→the protection unit P5→the battery pack P1→the current sensor P6→the main negative switch K2→the diode VD2 of the second power switching device S2 and the diode VD4 of the fourth power switching device S4→the first stator inductor L1 and the second stator inductor L2.

It should be noted that, in the above nine manners, non-target upper-bridge-arm switch units and non-target lower-bridge-arm switch units are all in a turning-off state.

Other relevant descriptions of step S501 and step S502 may be understood with reference to contents of the above embodiments, and will not be repeated herein.

In embodiments of the present disclosure, the battery management unit in the battery heating system determines that the state parameters of the battery pack meet the preset heating conditions, sends a control signal to the motor controller, and controls the motor controller to output a drive signal to the target upper-bridge-arm switch unit and the target lower-bridge-arm switch unit, so as to control the target upper-bridge-arm switch unit and the target lower-bridge-arm switch unit to be periodically turned on and off. Thus, an alternating current is generated in the circuit formed by the battery pack, the main positive switch, the target upper-bridge-arm switch unit, the motor, the target lower-bridge-arm switch unit, and the main negative switch, that is, the battery pack is charged and discharged alternately. The battery pack has an internal resistance. During the alternate charging and discharging of the battery pack, the alternating current flows through the internal resistance of the battery pack to generate heat, that is, the battery pack generates heat internally, thereby improving heating efficiency of the battery pack. In embodiments of the present disclosure, since heat is generated by the alternating current passing through the battery pack, heat generation inside the battery pack is uniform. Moreover, since the structures of the inverter and the motor are not changed, there will be no additional structural modification costs.

Figure 6:
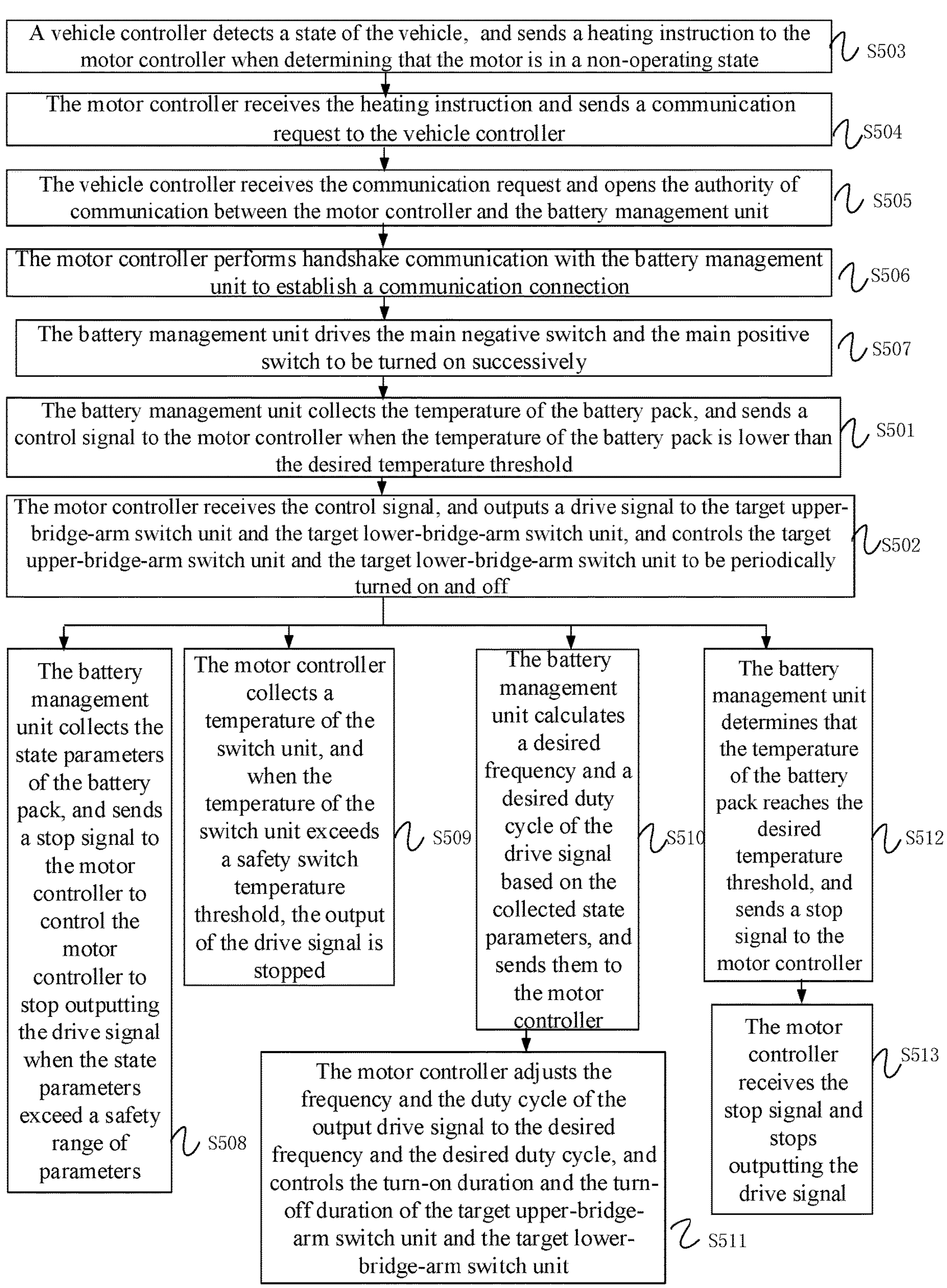
FIG. 6 is a flowchart of a control method of a battery heating system according to another embodiment of the present disclosure.

FIG. 6 is a flowchart of a control method of a battery heating system according to another embodiment of the present disclosure. FIG. 6 is different from FIG. 5 in that the control method of the battery heating system shown in FIG. 6 may further include steps S503 to S514.

In step S503, the vehicle controller detects a state of the vehicle, and sends a heating instruction to the motor controller when determining that the motor is in a non-operating state.

The battery heating system may also include a vehicle controller that may detect states of various components in the vehicle to obtain the state of the vehicle. If the motor is in a non-operating state, the vehicle is in a static state, that is, in a non-driving state. When the vehicle is in a non-driving state, the battery heating system may enter the heating mode. The vehicle controller sends a heating instruction to the motor controller to inform the motor controller that the battery heating system may enter the heating mode.

It should be noted that, before step S503, the battery management unit may collect the state parameters of the battery pack. If the state parameters of the battery pack meet the preset heating conditions, the vehicle controller performs step S503.

In step S504, the motor controller receives the heating instruction and sends a communication request to the vehicle controller.

The motor controller receives the heating instruction and needs to establish communication with the battery management unit. Then, the motor controller sends a communication request to the vehicle controller to request the vehicle controller to open the authority of communication between the motor controller and the battery management unit.

In step S505, the vehicle controller receives the communication request and opens the authority of communication between the motor controller and the battery management unit.

For example, the vehicle controller may configure communication parameters for the motor controller and the battery management unit to open the authority of communication between the motor controller and the battery management unit.

In step S506, the motor controller performs handshake communication with the battery management unit to establish a communication connection.

After the authority of communication between the motor controller and the battery management unit is opened, a communication connection may be established between the motor controller and the battery management unit. Specifically, the handshake communication may be initiated by the motor controller to the battery management unit, or initiated by the battery management unit to the motor controller, thereby establishing a communication connection between the motor controller and the battery management unit.

In step S507, the battery management unit drives the main negative switch and the main positive switch to be turned on successively.

When the battery heating system enters the heating mode, the battery management unit may first drive the main negative switch to be turned on, and then drive the main positive switch to be turned on. After step S507, the battery management unit may also report the turning-on/turning-off state of the main negative switch and the main positive switch to the vehicle controller. The vehicle controller determines that both the main negative switch and the main positive switch are turned on and informs the motor controller. The motor controller outputs a drive signal to the target upper-bridge-arm switch unit and the target lower-bridge-arm switch unit.

In step S508, the battery management unit collects the state parameters of the battery pack, and sends a stop signal to the motor controller to control the motor controller to stop outputting the drive signal when the state parameters exceed a safety range of parameters.

The state parameters may include a temperature and/or a voltage. If the state parameters include the temperature, the safety range of parameters includes a safety temperature range. If the temperature of the battery pack exceeds the safety range of parameters, for example, the battery pack is over-heated, the battery management unit sends a stop signal to the motor controller and the motor controller stops outputting the drive signal to the switch unit. If the state parameter includes the voltage, the safety range of parameters includes a safety voltage range. If the voltage of the battery pack exceeds the safety voltage range, for example, the battery pack is under-voltage, the battery management unit sends a stop signal to the motor controller and the motor controller stops outputting the drive signal to the switch unit. If the state parameters include both the temperature and the voltage, the battery management unit sends a stop signal to the motor controller and the motor controller stops outputting the drive signal to the switch unit when the temperature of the battery pack exceeds the safety range of parameters or the voltage of the battery pack exceeds the safety voltage range. The safety range of parameters may be set according to the work scene and work requirements, which is not limited herein.

The battery management unit collects the state parameters of the battery pack in real time, and detects the state parameters in real time. If the battery pack is found to be abnormal, the battery heating system exits the heating mode in order to ensure the safety of the battery heating system.

If the battery pack is found to be abnormal, in order to further ensure the safety of the battery heating system, the battery management unit may also control the main positive switch and the main negative switch to be turned off, thereby completely cutting off the circuit in the battery heating system.

In step S509, the motor controller collects a temperature of the switch unit, and when the temperature of the switch unit exceeds a safety switch temperature threshold, the output of the drive signal is stopped.

Specifically, a temperature sensor may be provided at the switch unit to collect the temperature of the switch unit. If the temperature of the switch unit (the switch unit includes the power switching device, the temperature of the switch unit includes the temperature of the power switching device) exceeds the safety switch temperature threshold, it indicates that the temperature of the switch unit is abnormal and it needs to exit the heating mode. Therefore, the motor controller stops outputting the drive signal.

In step S510, the battery management unit calculates a desired frequency and a desired duty cycle of the drive signal based on the collected state parameters, and sends the desired frequency and the desired duty cycle of the drive signal to the motor controller.

The battery heating system also includes a current sensor. The state parameters also includes current, which is specifically the current collected by the current sensor.

In some examples, a proportional-integral-derivative (PID) algorithm or other feedback adjustment algorithm may be used to calculate a desired frequency and a desired duty cycle of the drive signal based on state parameters collected in real time (such as the temperature, the state of charge, the current, and the like). The battery management unit may periodically collect state parameters and periodically calculate the desired frequency and desired duty cycle of the drive signal. The battery management unit may send the desired frequency and the desired duty cycle of the drive signal to the motor controller in real time, and may also periodically send the desired frequency and the desired duty cycle of the drive signal to the motor controller, which is not limited herein.

In step S511, the motor controller adjusts the frequency and the duty cycle of the output drive signal to the desired frequency and the desired duty cycle, and controls the turn-on duration and the turn-off duration of the target upper-bridge-arm switch unit and the target lower-bridge-arm switch unit.

When the frequency and the duty cycle of the drive signal change, the temperature, the state of charge, the current and the like in the battery heating system will change accordingly. The magnitude of the alternating current generated by the drive signal driving each of the switch units in the inverter is related to the frequency and the duty cycle of the drive signal. The larger the magnitude of the alternating current, the more heat the battery pack generates. The motor controller may adjust the frequency of the output drive signal to the desired frequency, and adjust the duty cycle of the output drive signal to the desired duty cycle, thereby adjusting the temperature, the state of charge, the current and the like in the battery heating system to stabilize the heating speed of the battery heating system. The frequency and the duty cycle of the drive signal may be adjusted periodically or in real time, which is not limited herein.

In step S512, the battery management unit determines that the temperature of the battery pack reaches the desired temperature threshold, and sends a stop signal to the motor controller.

The desired temperature threshold is the temperature threshold for the normal operation of the batteries. If the temperature of the battery pack reaches the desired temperature threshold, it is not necessary to continue to heat the batteries, and the battery heating system may exit the heating mode. The battery management unit may send a stop signal to the motor controller to control the motor controller to stop outputting the drive signal to the switch unit.

In step S513, the motor controller receives the stop signal and stops outputting the drive signal.

In some examples, the battery management unit determines that the temperature of the battery pack reaches the desired temperature threshold, and may also control the main positive switch and the main negative switch to be turned off, thereby cutting off the circuit of the battery heating system.

In some examples, after the motor controller stops outputting the drive signal and the circuit of the battery heating system is cut off, the communication connection between the battery management unit and the motor controller may be disconnected, which can be initiated by the battery management unit or the motor controller, which is not limited herein.

The motor controller and the battery management unit may also report to the vehicle controller that the battery heating system exits the heating mode, and that the communication connection between the battery management unit and the motor controller has been disconnected.

In some examples, the frequency of the drive signal ranges from 100 Hz to 100,000 Hz. The duty cycle of the drive signal ranges from 5% to 50%.

In some examples, the dead-time in the drive signal may also be set to ensure the safety of each of switch units. Specifically, the dead-time is set between the time when the level of the drive signal of the switch unit of the upper bridge arm in the same bridge arm changes and the time when the level of the drive signal of the switch unit of the lower bridge arm in the same bridge arm changes. The dead-time is related to the turn-on delay, the turn-on duration, the turn-off delay, and the turn-off duration of the switch unit.

Relevant descriptions of dead-time may be understood with reference to contents of the above embodiments, and will not be repeated herein.

It should be clear that the various embodiments in the present specification are described in a progressive manner such that same or similar parts among embodiments may be referred to each other and each embodiment is described by focusing on the differences from other embodiments. For control method embodiments, relevant parts may be referred to the description of battery heating system embodiments. The present disclosure is not limited to the specific steps and structures described above and illustrated in the drawings. A person skilled in the art may make various changes, modifications and additions, or change the order of the steps after understanding the spirit of the present disclosure. Also, for the purpose of concision, the detailed description of known technique is omitted herein.

Those skilled in the art shall appreciate that the foregoing embodiments are illustrative but not limiting. Different technical features appearing in different embodiments may be combined to achieve advantages. Those skilled in the art shall appreciate and implement other variant embodiments of the disclosed embodiments upon reviewing the drawings, the description and the claims. In the claims, the term "comprising" will not preclude another device(s) or step(s); the indefinite article "a/an" will not preclude plural; and the terms "first", "second", etc., are intended to designate a name but not to represent any specific order. Any reference number in the claims shall not be construed as limiting the scope of the present disclosure. Functions of a plurality of parts appearing in a claim may be performed by a separate hardware or software unit. Some technical features appearing in different dependent claims will not mean that these technical features cannot be combined to achieve advantages.

What is claimed is:

1. A battery heating control method, comprising:

collecting, by a battery management unit, state parameters of a battery pack, wherein the state parameters of the battery pack comprise a temperature and a state of charge of the battery pack;

sending, by the battery management unit, a heating instruction to a vehicle controller under a condition that the state parameters of the battery pack meet preset heating conditions, wherein the preset heating conditions comprise the temperature is lower than a desired temperature threshold and the state of charge is higher than a heating allowable state of charge threshold, wherein the heating instruction is forwarded to a motor controller by the vehicle controller under a condition that a motor is determined in a non-operating state, so that communication parameters for the motor controller and the battery management unit are set by the vehicle controller in response to a communication request sent by the motor controller based on the heating instruction;

performing, by the battery management unit, handshake communication according to the communication parameters to establish a communication connection with the motor controller;

calculating, by the battery management unit, a desired frequency and a desired duty cycle based on the state parameters of the battery pack; and sending, by the battery management unit, the desired frequency and the desired duty cycle to the motor controller, wherein the desired frequency and the desired duty cycle are used by the motor controller as a frequency and a duty cycle of a drive signal, wherein the drive signal is used by the motor controller for controlling a target upper-bridge-arm switch unit and a target lower-bridge-arm switch unit of an inverter coupled between the battery pack and the motor to perform a discharging operation by turning on the target upper-bridge-arm switch unit and the target lower-bridge-arm switch unit, and allowing electric current from the battery pack to be transmitted to and stored as energy in the motor, and perform a charging operation by turning off the target upper-bridge-arm switch unit and the target lower-bridge-arm switch unit, and allowing the energy stored in the motor to be transmitted as charging current to the battery pack, wherein the inverter includes a supporting capacitor, a first phase bridge arm, a second phase bridge arm and a third phase bridge arm connected in parallel;

the target upper-bridge-arm switch unit is a switch unit of the upper bridge arm of any one of the first phase bridge arm, the second phase bridge arm, and the third phase bridge arm; and the target lower-bridge-arm switch unit is a switch unit of the lower bridge arm of at least one of the bridge arms except the bridge arm where the target upper-bridge-arm switch unit is located.

2. The battery heating control method of claim 1, wherein the state parameters of the battery pack further comprise: a current flowing through the battery pack.

3. The battery heating control method of claim 1, wherein the drive signal is a pulse width modulation (PWM) signal.

4. The battery heating control method of claim 1, wherein the frequency of the drive signal ranges from 100 Hz to 100,000 Hz, and the duty cycle of the drive signal ranges from 5% to 50%.

5. The battery heating control method of claim 1, wherein the drive signal comprises a first drive signal for controlling the target upper-bridge-arm switch unit in the first phase bridge arm of the inverter and a second drive signal for controlling the target lower-bridge-arm switch unit in the second phase bridge arm of the inverter; and a dead-time is set between a time when a level of the first drive signal changes and a time when a level of the second drive signal changes.

6. The battery heating control method of claim 1, further comprising:

sending, by the battery management unit, a stop signal to the motor controller to control the motor controller to stop outputting the drive signal when the state parameters exceed a safety range of parameters.

7. A battery heating control method, comprising:

receiving, by a vehicle controller, a heating instruction from a battery management unit; wherein the heating instruction is sent by the battery management unit under a condition that state parameters of a battery pack meet preset heating conditions, wherein the state parameters of the battery pack comprise a temperature and a state of charge of the battery pack, and the preset heating conditions comprise the temperature is lower than a desired temperature threshold and the state of charge is higher than a heating allowable state of charge threshold;

forwarding, by the vehicle controller, the heating instruction to a motor controller under a condition that a motor is determined in a non-operating state;

receiving, by the vehicle controller, a communication request from the motor controller; wherein the communication request is sent by the motor controller based on the heating instruction; and setting, by the vehicle controller, communication parameters for the motor controller and the battery management unit, wherein the communication parameters are used for the battery management unit to establish a communication connection with the motor controller, wherein the communication connection is used by the battery management unit to send a desired frequency and a desired duty cycle to the motor controller, wherein the desired frequency and the desired duty cycle are used by the motor controller as a frequency and a duty cycle of a drive signal, wherein the drive signal is used for controlling a target upper-bridge-arm switch unit and a target lower-bridge-arm switch unit of an inverter coupled between the battery pack and the motor to perform a discharging operation by turning on the target upper-bridge-arm switch unit and the target lower-bridge-arm switch unit, and allowing electric current from the battery pack to be transmitted to and stored as energy in the motor, and perform a charging operation by turning off the target upper-bridge-arm switch unit and the target lower-bridge-arm switch unit, and allowing the energy stored in the motor to be transmitted as charging current to the battery pack, wherein the inverter includes a supporting capacitor, a first phase bridge arm, a second phase bridge arm and a third phase bridge arm connected in parallel;

the target upper-bridge-arm switch unit is a switch unit of the upper bridge arm of any one of the first phase bridge arm, the second phase bridge arm, and the third phase bridge arm; and the target lower-bridge-arm switch unit is a switch unit of the lower bridge arm of at least one of the bridge arms except the bridge arm where the target upper-bridge-arm switch unit is located.

8. The battery heating control method of claim 7, wherein the state parameters of the battery pack further comprise: a current flowing through the battery pack.

9. The battery heating control method of claim 7, wherein the drive signal is a pulse width modulation (PWM) signal.

10. The battery heating control method of claim 7, wherein the frequency of the drive signal ranges from 100 Hz to 100,000 Hz, and the duty cycle of the drive signal ranges from 5% to 50%.

11. The battery heating control method of claim 7, wherein the drive signal comprises a first drive signal for controlling the target upper-bridge-arm switch unit in the first phase bridge arm of the inverter and a second drive signal for controlling the target lower-bridge-arm switch unit in the second phase bridge arm of the inverter; and a dead-time is set between a time when a level of the first drive signal changes and a time when a level of the second drive signal changes.

12. A battery heating control method, comprising:

generating, by an inverter coupled between a battery pack and a motor, a drive signal based on a desired frequency and a desired duty cycle for heating the battery pack, wherein the inverter comprises a motor controller, an upper-bridge-arm switch unit, a lower-bridge-arm switch unit, and a plurality of bridge arms each of which corresponding to a specific phase stator inductor in the motor, and the upper-bridge-arm switch unit controls a first phase bridge arm selected from the plurality of bridge arms, the lower-bridge-arm switch unit controls a second phase bridge arm selected from the plurality of bridge arms, and the first phase bridge arm is different from the second phase bridge arm;

performing, by the motor controller in response to the driving signal, a discharging operation by turning on the upper-bridge-arm switch unit and the lower-bridge-arm switch unit, and allowing electric current from the battery pack to be transmitted to and stored as energy in the motor; and performing, by the motor controller in response to the driving signal, a charging operation by turning off the lower-bridge-arm switch unit and the upper-bridge-arm switch unit, and allowing the energy stored in the motor to be transmitted as charging current to the battery pack.

13. The battery heating control method of claim 12, wherein each of the upper-bridge-arm switch unit and the lower-bridge-arm switch unit contains a corresponding switch which when being turned on, causing the electric current being transmitted from the battery pack to the motor during the discharging operation, and contains a corresponding diode which when the corresponding switch is turned off, causing the charging current being transmitted from the motor to the battery pack during the charging operation.

* * * * *